United States Patent
Zipper

(10) Patent No.: US 6,285,214 B1
(45) Date of Patent: Sep. 4, 2001

(54) OUTPUT BUFFER STAGE FOR USE WITH A CURRENT CONTROLLED OSCILLATOR

(75) Inventor: Eliav Zipper, Ramat Gan (IL)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/494,447

(22) Filed: Jan. 31, 2000

(51) Int. Cl.[7] .......................... H03K 19/094; H03B 1/00
(52) U.S. Cl. .................. 326/83; 326/81; 326/80; 327/108; 327/256; 327/291; 331/57
(58) Field of Search .................. 326/80, 81, 83; 327/108–112, 256, 291; 331/57, 177 R

(56) References Cited

U.S. PATENT DOCUMENTS

| | | | | |
|---|---|---|---|---|
| 5,300,898 | * | 4/1994 | Chen et al. | 331/57 |
| 5,512,861 | | 4/1996 | Sharma | 331/74 |
| 5,682,123 | * | 10/1997 | Chau | 331/57 |
| 5,821,821 | * | 10/1998 | Ahdab et al. | 331/57 |
| 5,828,258 | * | 10/1998 | Ooishi et al. | 327/291 |
| 5,920,217 | * | 7/1999 | Mellot | 327/175 |
| 5,963,102 | * | 10/1999 | Pang | 331/57 |
| 6,037,811 | * | 3/2000 | Ozguc | 327/108 |

\* cited by examiner

Primary Examiner—Michael Tokar
Assistant Examiner—Vibol Tan

(57) ABSTRACT

A buffer stage for buffering an input signal generated by a current controlled oscillator comprising: an input terminal that receives the input signal, an output terminal that outputs a buffered signal, at least one buffer, coupled between the input and output terminals that buffers the input signal to generate the buffered signal, the at least one buffer having a current control terminal; and at least one current source having an output coupled to the current control terminal of the at least one buffer, the at least one current source further including at least one control terminal that receives a buffer control signal so that the current output from the current source substantially equals the current sourced by the at least one buffer.

24 Claims, 2 Drawing Sheets

-PRIOR ART-

-PRIOR ART-

OUTPUT BUFFER STAGE FOR USE WITH A CURRENT CONTROLLED OSCILLATOR

FIELD OF THE INVENTION

An output buffer stage for use with a current controlled oscillator and especially an output buffer stage that receives an input signal having a first duty cycle and provides a buffered signal having a second duty signal, the second duty cycle is substantially equal to the first duty cycle over a large range of frequencies.

BACKGROUND OF THE INVENTION

Controlled oscillators are used in a variety of integrated circuits. A frequency of an output signal of a controlled oscillator is responsive to a control signal provided to the controlled oscillator. There are various types of controlled oscillators, and one of the most common types is a current controlled oscillator (ICO). A typical ICO is comprised of a controlled current source coupled to a ring of odd number of inverters, an output of an inverter is coupled to an input of a succeeding inverter and an output of the last inverter is coupled to an input of a first inverter. Typical inverters comprise of CMOS transistors, but this is not necessary.

A frequency of an output signal of the ICO is inversely proportional to the delay/switching time of the inverters that form the oscillator. The switching time of an inverter corresponds to a time necessary to charge and discharge an input capacitance of a successive inverter to a level respectively above or below a switching threshold of a successive inverter. The charge and discharge period is determined by the magnitude of current that is used to charge the input capacitance. This current is provided by a controlled current source.

The peak to peak voltage of the output signal (ICOS) of some prior art ICO is relatively low, and there is a need to be amplified. The peak to peak voltage decreases when the frequency of ICOS decreases. Usually, there is a need to amplify ICOS to CMOS compatible levels.

U.S. Pat. No. 5,512,861 of Sharma discloses a buffer stage for use with a current controlled oscillator. This prior art buffer stage, comprising of current controlled buffer (i.e.— A1) 60 followed by a CMOS buffer 45, and a current controlled oscillator (ICO) 30 that is coupled to the buffer stage are schematically described in FIG. 1.

Referring to FIG. 1, ICO 30 comprising adjustable current source (i.e.—S1) 22 and ring oscillator 10. S1 22 has its high side connected to a positive voltage supply rail VDD supplies, and its low side 5 connected to the high side of a three stage ring oscillator 10. S1 22 is adjusted by a frequency control signal 8.

Ring oscillator 10 comprises three CMOS inverters 11, 12, 13. At least five inverters within the ring oscillator give a better performance than the use of three inverters. The high side of each inverter is connected to the low side 5 of S1 22. The low side of each inverter is connected to a negative supply rail VSS. The output of each inverter, starting with the left-most inverter, is connected to the input of the succeeding inverter. The output 25 of the right-most inverter is connected to the input of the left-most inverter.

Inverters 11, 12 and 13 comprising of P-MOS and N-MOS transistors MPB 111, 121, 131 and MNB 112, 122 and 132 respectively. The source terminals of transistors MPB 111, 121 and 131 are connected to low side 5 of S1 22. The source terminals of transistors MNB 112, 122 and 132 are connected to the negative rail supply VSS. The drain terminals of transistors MPB 111 and MNB 11, MPB 121 and MNB 122, MPB 131 and MNB 132 are connected to form the output terminals of inverters 11, 12 and 13 respectively. The gate terminals of transistor MPB 111, 121, 131 and MNB 112, 122 are connected to from the output terminals of inverters 11, 12 and 13.

S1 22 and ring oscillator 10 are connected together in such a manner that they form an asymmetrical ICO 30.

The output of ring oscillator 10 is coupled to the input of A1 60, that is followed by CMOS buffer 45 which is directly supplied by the positive and negative supply rails, VDD and VSS respectively. A1 60 provides a current controlled buffer output signal (i.e.—A10) 50.

A1 60 comprises of buffer BA1 61 comprising of P-MOS and N-MOS transistors TMPB 63 and TMNB 64 and adjustable current source (i.e.—SA1) 61, controlled by control signal 8. The low side of BA1 61 is connected to the negative supply rail VSS, whilst its high side HA1 is connected to the low side of SA1 61. The high side of SA1 61 is connected to the positive supply rail VDD.

The source terminals of transistors MPB 63 and MNB 64 are respectively connected to the positive supply rail VDD and the low side of SA1 61, and their drain terminals are connected together to form the output terminal of the A1 60. The gate terminals of transistor TMNB 63 and TMPB 64 are connected to the output of ring oscillator 10.

In order to change the frequency of the signal at the output 55 of CMOS buffer 45, it is necessary to adjust the frequency control signal 8 of S1 22 and SA1 61. S1 22 sources current Ib 220 to ring oscillator 10, whilst SA1 61 sources current Ic 610 to BA1 61. Adjusting the frequency control signal 8 will cause the magnitudes of both currents Ib 220 and Ic 610 to alter. An increase in the magnitude of current Ib 220 results in an increase in the frequency of the output signal (i.e.—ROS) 25 of ring oscillator 10 and vice-versa.

Simulations and calculations have shown that at low frequencies signal A10 50 has an oscillating signal component OSC 501 component and unwanted DC component DCC 502, that causes A10 50 to drift. This drift causes buffer 45 to clip and provide output signal 55 that has a much smaller duty cycle than the duty cycle of ROS 25. An example of the measured A10 50 and output signal 25 are shown in FIG. 2.

DCC 502 is generated because the amount of current sourced by TMPB 63 is proportional to a logarithm of the voltage at point 5 (i.e.—VP5) 75, while the current sinking capability of TMNB 64 is substantially proportional to $(VP5)^2$. V05 75 substantially equals the peak to peak voltage of ROS 25.

Thus, at low frequencies, when VP5 is decreased, TMNB 63 starts to source more current than TMPB 64 can sink. TMPB64 is forced to decrease the voltage potential between its source and drain while TMNB 63 is forced to increase the voltage potential between its source and drain, DCC 502 reflects that increment.

There is a need to provide an output buffer stage for a current controlled oscillator that provides a buffered signal having a duty cycle that is substantially equal to the duty cycle of the output signal of the ICO over a large range of frequencies.

There is a need to provide an output buffer stage for a current controlled oscillator that provides a buffered signal having a duty cycle that is substantially equal to the duty cycle of the input signal.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

The invention provides a buffer stage for buffering an input signal generated by a current controlled oscillator, the buffer stage amplifies the input signal and provides an buffered signal having a duty cycle that is substantially equal to the duty cycle of the input signal.

The invention provides a buffer stage for buffering an input signal generated by a current controlled oscillator, the buffer stage comprises of at least one buffer coupled to at least one current source, the at least buffer sources a current that is responsive to the input signal magnitude, the at least one current source provides a current that substantially equals the current sourced by the at least buffer.

The invention provides a buffer stage for buffering an input signal generated by a current controlled oscillator, the buffer stage comprises of at least one buffer coupled to at least one current source, the at least one current source emulates the at least one buffer so that an unwanted drift of the buffered signal is prevented.

The invention provides a buffer stage for buffering an input signal generated by a current controlled oscillator, the buffer stage comprises of at least one buffer coupled to at least one current source, the at least one current source supplies the at least one buffer a current that is substantially proportional to a square of a peak to peak voltage of the input signal.

Figure 1:
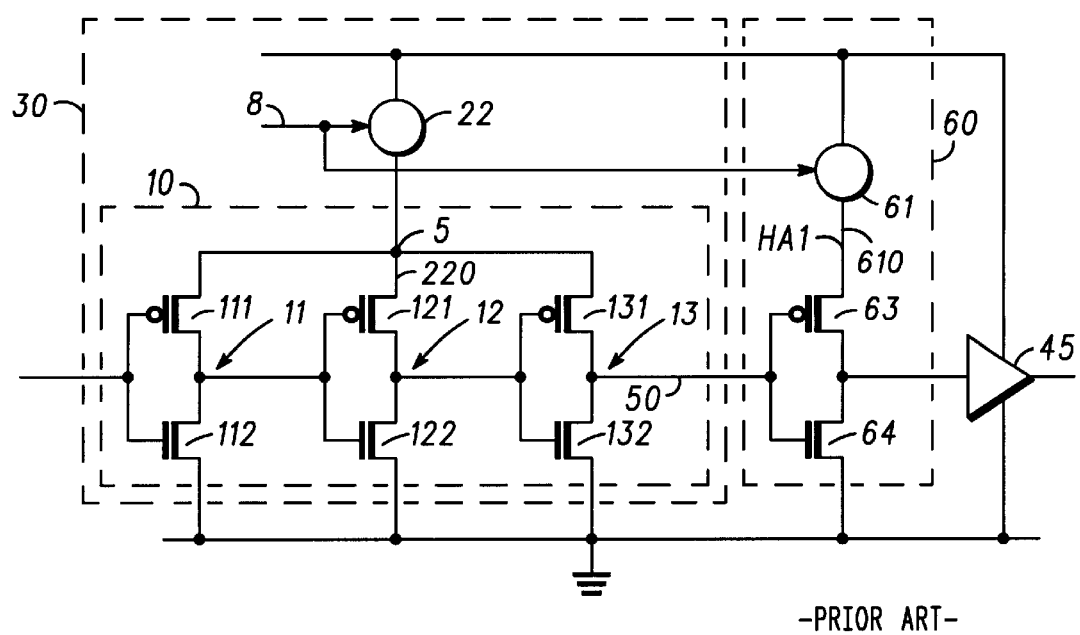
FIG. 1 is a schematic description of a prior art current controlled oscillator and a output buffer stage.
Figure 2:
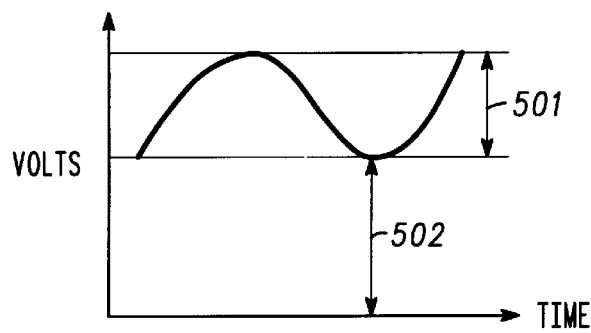
FIG. 2. Is a schematic description of some waveforms generated by the prior art current controlled oscillator and output buffer stage.
Figure 3:
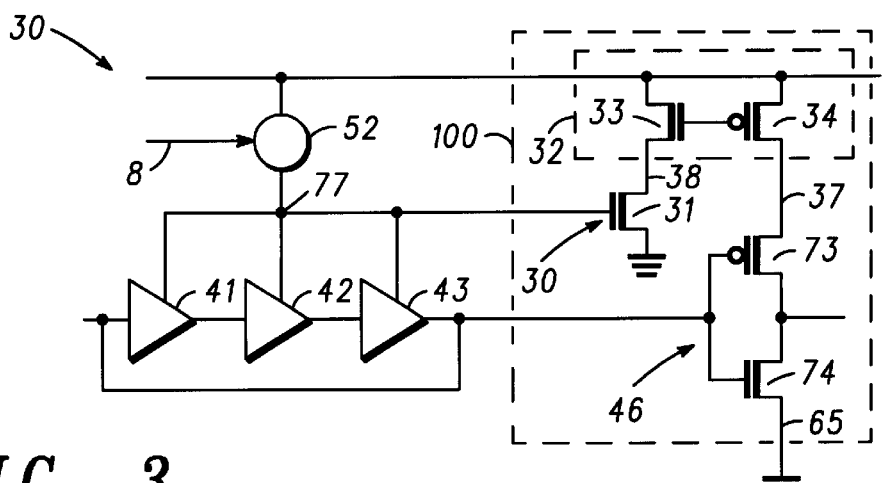
FIGS. 3–5 are schematic descriptions of an current controlled oscillator and an output buffer stage, according to preferred embodiments of the invention.
Figure 4:
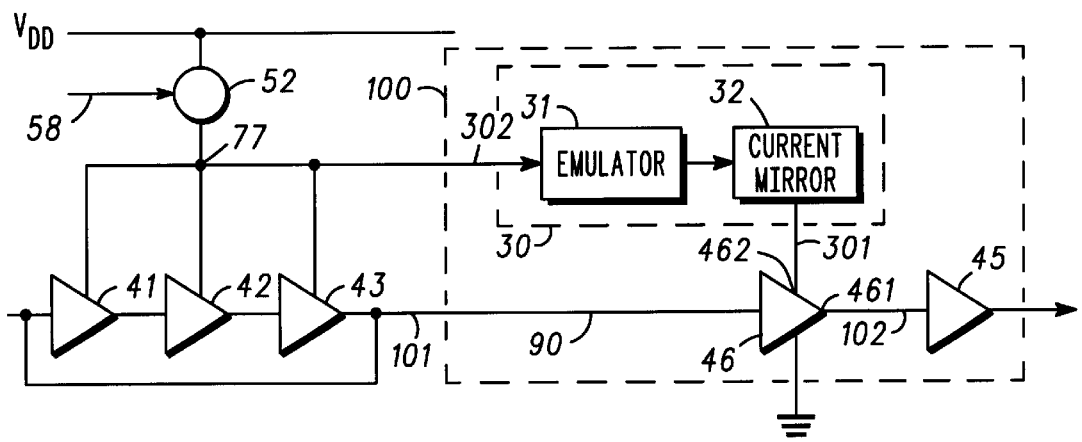
Figure 5:
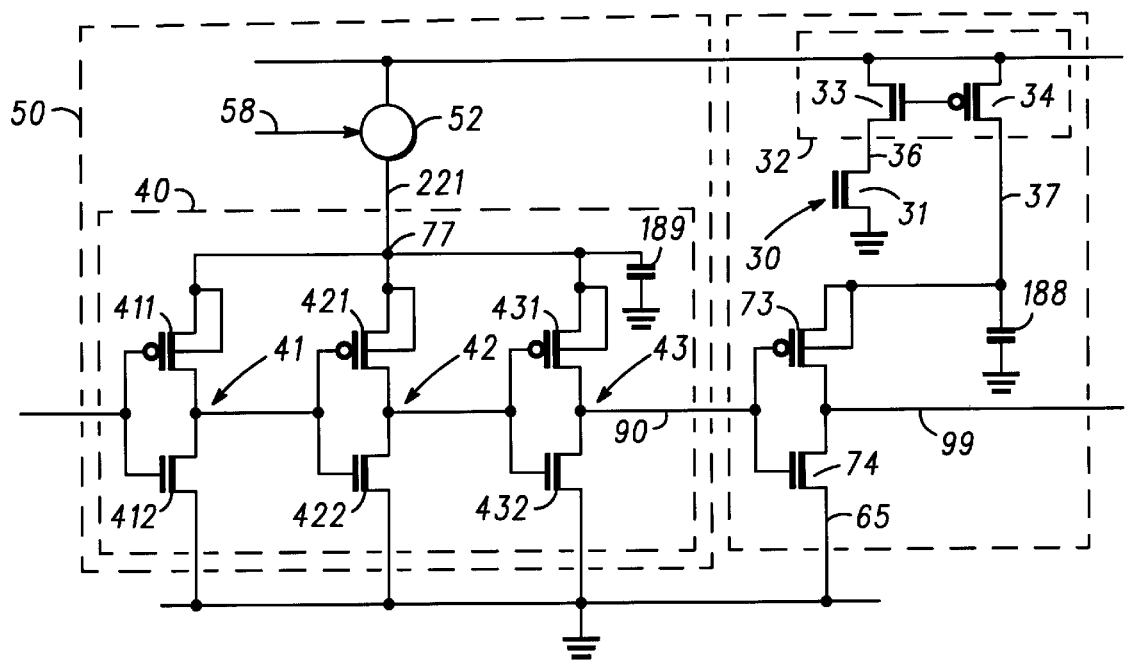

Referring to FIGS. 3–5 controlled ICO 50 comprising adjustable current source (i.e.—SS1) 52 and ring oscillator 40. SS1 52 has its high side connected to a positive voltage supply rail VDD supplies, and its low side 77 connected to the high side of a three stage ring oscillator 40. SS1 52 is adjusted by a frequency control signal 58.

Conveniently, ring oscillator 40 comprises three CMOS inverters 41, 42, 43. The high side of each inverter is connected to the low side 77 of SS1 52. The low side of each inverter is connected to the ground. The output of each inverter, starting with the left-most inverter, is connected to the input of the succeeding inverter. The output of the right-most inverter is connected to the input of the left-most inverter.

Inverters 41, 42 and 43 comprising of P-MOS and N-MOS transistors MPB 411, 421, 431 and MNB 412, 422 and 432 respectively. The source terminals of transistors MPB 411, 421 and 431 are connected to low side 77 of SS1 52. The source terminals of transistors MNB 412, 422 and 432 are connected to the ground. The drain terminals of transistors MPB 411 and MNB 412, MPB 421 and MNB 422, MPB 431 and MNB 432 are connected to form the output terminals of inverters 41, 42 and 43 respectively. The gate terminals of transistor MPB 411, 421, 431 and MNB 412, 422 are connected to from the output terminals of inverters 41, 42 and 43. SS1 52 and ring oscillator 40 are connected together in such a manner that they form an asymmetrical ICO 50. Ring oscillator 40 provides an input signal SI 90 to controlled buffer 46.

Buffer stage 100 has a controlled buffer 46 and adjustable current source 30. Conveniently, buffer stage 100 also comprises a CMOS buffer 45 that follows controlled buffer 46. CMOS buffer 45 which is directly supplied by the positive and supply rail VDD and by the ground. Preferably, CMOS buffer 45 outputs a CMOS compatible output signal.

An output terminal of ring oscillator 40 is coupled to input terminal 101 of buffer stage 100 for providing input signal 90. Buffer stage provides buffered signal 99 via an output terminal. Conveniently, an output terminal of CMOS buffer 45 forms output terminal 102 of buffer stage 100. Buffer stage 100 buffers input signal 90 to generate buffered signal 99. Controlled buffer (i.e. CB) 46 has a current control terminal 462 for receiving buffer control signal from adjustable current source 30.

CB 46 comprising of P-MOS and N-MOS transistors TMPB 73 and TMNB 74 and adjustable current source 30 further comprising emulator 31 and current mirror 32. Conveniently, emulator 31 is an NMOS transistor that is substantially equal to NMOS transistor 432 of inverter 43. Emulator 31 emulates the a portion of the ring oscillator that determines the current sourced by the controlled buffer 46.

The low side of CB 46 is connected to the ground, while high side 462 is connected to the low side of adjustable current source 30. The high side of adjustable current source 30 is connected to the positive supply rail VDD.

The source terminals of transistors MPB 73 and MNB 74 are respectively connected to the positive supply rail VDD and the low side of adjustable current source 30, and their drain terminals are connected together to form the output terminal of CB 46. The gate terminals of transistor TMNB 73 and TMPB 74 are connected to the output of ring oscillator 40. Conveniently, current mirror 32 is comprised of an NMOS transistor 33 and a PMOS transistor 43. The drain of NMOS 33 and the source of PMOS 34 are coupled to the positive supply rail VDD. The gates of PMOS 34 and NMOS 33 are coupled. The drain of NMOS 33 is coupled to node77. The drain of PMOS 34 is coupled to the source of PMOS 73. Current mirror receives a current Ie1 36 from NMOS 31 and provides PMOS 73 a control signal Ie2 37, Ie2 37 is substantially equal Ie1 36.

Conveniently, CB 46 and especially CMOS buffer 45 are configured to amplify input signal 90.

Conveniently, the threshold voltage of the PMOS transistors of both ICO 50 and buffer stage 100 are substantially equal to the threshold voltage of the NMOS transistors of ICO 50 and buffer stage 100.

In order to change the frequency of the signal at the output 451 of CMOS buffer 45, it is necessary to adjust the frequency control signal 8 of SS1 52. The change in control signal 8 causes the peak to peak voltage of IS 90 to alter, and accordingly VP77 to alter. The voltage potential between the gate and the source (i.e.—Vgs31) of NMOS 31 equals the voltage at node 77 (i.e.—VP77). Ie2 36 substantially equals $(VP77-Vth31)^2$ Vth31 being a threshold voltage of NMOS 31. On the other hand, IS 90 is provided to NMOS 432 and generates a drain current that substantially equals $(IS-Vth432)^2$. NMOS 31 emulated NMOS 432 in a manner that prevents output signal 461 to drift.

VP77 tracks IS, and Iel 36 generated by NMOS 31 equals the current supplied to CB 46. The current supplied by adjustable current source 30 equals the current sourced by CB 46.

Output signal 461 of CB 46 does not drift and has a duty cycle that substantially equals the duty cycle of IS 90. Conveniently, input signal 90 and output signal 99 have a duty cycle of 50%.

Buffer stage 100 can have more than a single controlled buffer. In such a configuration each controlled buffer will receive a current from an adjustable current source that has a plurality of current mirrors, for duplicating the current provided by emulator 31 to the plurality of controlled buffers. Ring oscillator 40 and buffer stage can be implemented by a variety of transistors, such as bipolar transistors.

Conveniently, ICO 50 and buffer stage 100 suppress power source Vcc noises. This is achieved by coupling the bulks of MPB 411, 421, 431 and 73 to node 77 instead of coupling the said bulks to power supply source Vcc. In order to improve the noise rejection of the mentioned above noise at high frequencies two additional capacitors are coupled to ICO 50 and buffer stage 100 accordingly. First capacitor C1 189 is coupled between the ground and node 77 and a second capacitor C2 188 is coupled between the ground and the drain of PMOS 73.

Thus, there has been described herein an embodiment including at least one preferred embodiment of an improved buffer stage for use with a current controlled oscillator. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A buffer stage for buffering an input signal generated by a current controlled oscillator, the buffer stage comprising:
    an input terminal that receives the input signal;
    an output terminal that outputs a buffered signal;
    at least one buffer, coupled between the input and output terminals, that buffers the input signal to generate the buffered signal, the at least one buffer having a current control terminal; and
    at least one adjustable current source having an output coupled to the current control terminal of the at least one buffer, the at least one current source further including at least one control terminal that receives a buffer control signal reflecting the magnitude of the input signal, wherein the current output from the current source substantially equals the current sourced by the at least one buffer;
    wherein the current controlled oscillator comprising of a ring of CMOS inverters and a oscillator current source coupled to each other at a first node;
    wherein an output inverter of the current controlled oscillator provides the input signal;
    wherein the output inverter has a NMOS transistor serially coupled to a PMOS transistor, a source of the PMOS transistor is coupled to the oscillator current source, and a source of the NMOS transistor is coupled to the ground; a drain of the NMOS and the PMOS transistors are coupled to each other to form an output terminal of the current controlled oscillator; a gate of the PMOS and the NMOS are coupled to form an input terminal of the output inverter; and
    wherein the at least one control terminal is coupled to the first node for receiving the buffer control signal.

2. The buffer stage of claim 1 wherein the at least one buffer comprising an amplifying buffer having a control terminal coupled to the adjustable current source.

3. The buffer stage of claim 1 wherein the buffer stage has an output buffer, and the buffered signal has a peak to peak voltage, wherein the output buffer is connected between a power supply having a first value and a ground, so that the peak to peak voltage of the buffered signal substantially equals the first value.

4. The buffer stage of claim 1 wherein the input signal has a first duty cycle and the buffered signal has a second duty cycle; and
    wherein, the first duty cycle substantially equals the second duty cycle.

5. The buffer stage of claim 1 wherein the current controlled oscillator is coupled to an oscillator current source at a first node, the current provided by the oscillator current source determined the frequency of the input signal, the buffered control signal is responsive to a voltage at the first node.

6. The buffer stage of claim 5 wherein the voltage at the first node substantially equals a peak to peak voltage of the input signal.

7. The buffer stage of claim 6 wherein the at least one adjustable current source comprising at least one current mirror and at least one current source transistor; and
    wherein at least one current source transistor is coupled to the first node and to at least one input of the at least one current mirror; at least one output of the at least one current mirror is coupled to the at least one current controlled terminal of the at least one buffer.

8. The buffer stage of claim 7 wherein the at least one current source transistor substantially equals the NMOS transistor of the output inverter.

9. A buffer stage for buffering an input signal generated by a current controlled oscillator, the buffer stage comprising:
    an input terminal that receives the input signal;
    an output terminal that outputs a buffered signal;
    at least one buffer, coupled between the input and output terminals, that buffers the input signal to generate the buffered signal, the at least one buffer having a current control terminal; and
    at least one adjustable current source having an output coupled to the current control terminal of the at least one buffer, the at least one current source further including at least one control terminal that receives a buffer control signal reflecting the magnitude of the input signal, wherein the current output from the adjustable current source is substantially proportional to a square of the peak to peak voltage of the input signal.

10. The buffer stage of claim 9 wherein the at least one buffer comprising an amplifying buffer having a control terminal coupled to the current source.

11. The buffer stage of claim 9 wherein the current controlled oscillator is coupled to an oscillator current source at a first node, the current provided by the oscillator current source determined the frequency of the input signal, the buffered control signal is responsive to a voltage at the first node.

12. The buffer stage of claim 11 wherein the voltage at the first node substantially equals a peak to peak voltage of the input signal.

13. The buffer stage of claim 9 wherein the current controlled oscillator comprising of a ring of CMOS inverters and a oscillator current source coupled to each other at a first node;
   wherein an output inverter of the current controlled oscillator provides the input signal;
   wherein the output inverter has a NMOS transistor serially coupled to a PMOS transistor, a source of the PMON transistor is coupled to the oscillator current source, and a source of the NMOS transistor is coupled to the ground; a drain of the NMOS and the PMOS transistors are coupled to each other to form an output terminal of the current controlled oscillator; a gate of the PMOS and the NMOS are coupled to form an input terminal of the output inverter; and
   wherein the at least one control terminal is coupled to the first node for receiving the buffer control signal.

14. The buffer stage of claim 13 wherein the at least one adjustable current source comprising at least one current mirror and at least one current source transistor; and
   at least one current source transistor is coupled to the first node and to an least one input of the at least one current mirror; at least one output of the at least one current mirror is coupled to the at least one current controlled terminal of the at least one buffer.

15. The buffer stage of claim 14 wherein the at least one adjustable current source transistor substantially equals the NMOS transistor of the output inverter.

16. The buffer stage of claim 9 wherein the input signal has a first duty cycle and the buffered signal has a second duty cycle; and
   wherein, the first duty cycle substantially equals the first duty cycle.

17. A buffer stage for buffering an input signal generated by a current controlled oscillator, the buffer stage comprising:
   an input terminal that receives the input signal;
   an output terminal that outputs a buffered signal;
   at least one buffer, coupled between the input and output terminals, that buffers the input signal to generate the buffered signal, the at least one buffer having a current control terminal; and
   at least one adjustable current source having an output coupled to the current control terminal of the at least one buffer, the at least one current source further including at least one control terminal that receives a buffer control signal reflecting the magnitude of the input signal, the at least one adjustable current source emulates the at least one buffer.

18. The buffer stage of claim 17 wherein the input signal has a first duty cycle and the buffered signal has a second duty cycle; and
   wherein, the first duty cycle substantially equals the first duty cycle.

19. The buffer stage of claim 17 wherein the current controlled oscillator is coupled to an oscillator current source at a first node, the current provided by the oscillator current source determined the frequency of the input signal, the buffered control signal is responsive to a voltage at the first node.

20. The buffer stage of claim 19 wherein the current controlled oscillator comprising of a ring of CMOS inverters and a oscillator current source coupled to each other at a first node;
   wherein an output inverter of the current controlled oscillator provides the input signal;
   wherein the output inverter has a NMOS transistor serially coupled to a PMOS transistor, a source of the PMON transistor is coupled to the oscillator current source, and a source of the NMOS transistor is coupled to the ground; a drain of the NMOS and the PMOS transistors are coupled to each other to form an output terminal of the current controlled oscillator; a gate of the PMOS and the NMOS are coupled to form an input terminal of the output inverter;
   wherein the at least one control terminal is coupled to the first node for receiving the buffer control signal;
   wherein the at least one current source comprising at least one current mirror and at least one current source transistor; and
   wherein at least one current source transistor is coupled to the first node and to an least one input of the at least one current mirror; at least one output of the at least one current mirror is coupled to the at least one current controlled terminal of the at least one buffer.

21. The buffer stage of claim 20 wherein the at least one adjustable current source transistor substantially equals the NMOS transistor of the output inverter.

22. A method for buffering an input signal generated by a current controlled oscillator, the method comprising the steps of:
   providing the input signal to an input terminal of a current controlled buffer stage and providing a buffer control signal reflecting a peak to peak voltage of the input signal to a control terminal of an adjustable current source;
   generating a control signal from the buffer control signal, providing the control signal to a control terminal of the buffer stage while the buffer stage generates the buffered signal; and
   wherein the control signal equals the current sourced by the buffer stage;
   wherein the step of generating a control signal from the buffer control signal and providing the control signal to a control terminal involves:
      emulating the behavior of a last stage of the current controlled oscillator;
      mirroring a control signal provided during the emulation to the control terminal.

23. The method of claim 22 wherein the input signal has a first duty cycle and the buffered signal has a second duty cycle; and
   wherein, the first duty cycle substantially equals the second duty cycle.

24. A method for buffering an input signal generated by a current controlled oscillator, the method comprising the steps of:
   providing the input signal to an input terminal of a current controlled buffer stage and providing a buffer control signal reflecting a peak to peak voltage of the input signal to a control terminal of an adjustable current source;
   generating a control signal from the buffer control signal, providing the control signal to a control terminal of the buffer stage while the buffer stage generates the buffered signal; and
   wherein the control signal is substantially proportional to a square of the peak to peak voltage of the input signal.

* * * * *